United States Patent [19]

Yamaguchi et al.

[11] Patent Number: 5,011,760
[45] Date of Patent: Apr. 30, 1991

[54] PHOTOPOLYMERIZABLE COMPOSITION

[75] Inventors: Jun Yamaguchi, Shizuoka; Masaki Okazaki; Yoshio Inagaki, both of Kanagawa, all of Japan

[73] Assignee: Fuji Photo Film Co., Ltd., Kanagawa, Japan

[21] Appl. No.: 522,406

[22] Filed: May 11, 1990

Related U.S. Application Data

[63] Continuation of Ser. No. 250,191, Sep. 28, 1988, abandoned.

[30] Foreign Application Priority Data

Sep. 28, 1987 [JP] Japan .................... 62-243464

[51] Int. Cl.$^5$ .................................. G03F 7/029
[52] U.S. Cl. .................... 430/281; 430/914; 430/915; 430/920; 522/31; 522/63
[58] Field of Search ............ 430/281, 138, 914, 915, 430/920, 926; 522/31, 63

[56] References Cited

U.S. PATENT DOCUMENTS

| | | | |
|---|---|---|---|
| 3,100,703 | 8/1963 | Sprague et al. | 430/281 |
| 4,272,609 | 6/1981 | Klüpfel | 430/288 |
| 4,307,182 | 12/1981 | Dalzell et al. | 430/339 |
| 4,343,891 | 8/1982 | Aasen et al. | 430/337 |
| 4,657,846 | 4/1987 | Kokubo et al. | 430/434 |
| 4,686,175 | 8/1987 | Ogawa et al. | 430/505 |
| 4,737,445 | 4/1988 | Frommeld et al. | 430/281 |
| 4,740,455 | 4/1988 | Kubodera et al. | 430/353 |
| 4,743,531 | 5/1988 | Farid et al. | 430/281 |
| 4,755,450 | 7/1988 | Sanders et al. | 430/285 |
| 4,772,530 | 9/1988 | Gottschalk et al. | 430/138 |
| 4,772,541 | 9/1988 | Gottschalk et al. | 430/339 |
| 4,937,161 | 6/1990 | Kita et al. | 430/920 |
| 4,952,480 | 8/1990 | Yamaguchi et al. | 430/915 |

*Primary Examiner*—Marion E. McCamish
*Assistant Examiner*—Christopher D. RoDee
*Attorney, Agent, or Firm*—Sughrue, Mion, Zinn, Macpeak & Seas

[57] ABSTRACT

A photopolymerizable composition which comprises (a) a polymerizable compound having at least one ethylenic unsaturated bond, and (b) a salt formed by an organic cationic dye compound and an organic boron compound anion, wherein the salt is represented by the following formula (I), in which an organic cationic dye compound is employed as D$^\oplus$ to impart high spectral sensitivities to the composition

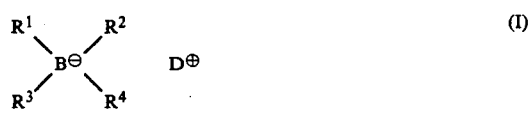

wherein D$^\oplus$ represents a cationic dye, and R$^1$, R$^2$, R$^3$ and R$^4$, which may be the same or different, each represents an alkyl group, an aryl group, an aralkyl group, an alkaryl group, an alkenyl group, an alkynyl group, or a group derived therefrom; and two or more of the substituent groups R$^1$ and R$^4$ can be combined to form a cyclic structure. The cationic dye D$^\oplus$ is represented by formula (II)

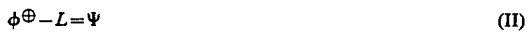

wherein $\phi$ and $\Psi$, which may be the same or different, each represents a heterocyclic ring containing at least one nitrogen atom, and L represents a methine group, or a tri-, penta-, hepta- or nona-methine group formed by linking methine groups one after another by conjugated double bonds, each of which may be substituted, provided that L combines with at least either $\phi$ or $\Psi$ to form a ring.

3 Claims, No Drawings

PHOTOPOLYMERIZABLE COMPOSITION

This is a continuation of application Ser. No. 07/250,191 filed Sept. 28, 1988, now abandoned.

FIELD OF THE INVENTION

The present invention relates to a photopolymerizable composition containing a novel photopolymerization initiator and, more particularly, to a highly sensitive, spectrally sensitized photopolymerizable composition which can be used for making a lithographic printing plate, a resinous relief printing plate, resist or photomask for a printed circuit substrate, pressure developable color image (including black and white image) transfer sheets, or color forming sheets.

BACKGROUND OF THE INVENTION

A photopolymerizable composition basically contains a photopolymerization initiator and an addition polymerizable compound having two or more ethylenic unsaturated bonds in a molecule (called "a polyfunctional monomer" hereinafter), and changes its tackiness or its solubility in a solvent through the hardening thereof when irradiated with light. Due to these properties, it is used for many purposes, for example, photography, graphic arts, metal surface treatment, ink, and so on. The principles and application examples thereof are described in many books. For instance, there are detailed descriptions in J. Kosar, *Light Sensitive Systems*, pp. 158-193, J Wiley & Sons, New York (1965), K. I. Jacobson & R. E. Jacobson, *Imaging Systems*, pp. 181-222, J. Wiley & Sons, New York (1976), and so on.

Recently, image forming systems utilizing light-sensitive microcapsules enclosing a photopolymerizable composition have also been proposed as one of the image forming methods to which photopolymerizable compositions are applied. For instance, methods of forming dye images, which involve exposing imagewise a color forming sheet coated with microcapsules enclosing a dye and photopolymerizable composition comprising a vinyl compound and a photopolymerization initiator, superposing an image receiving sheet on the color forming sheet, and then applying pressure to the whole surface of the superposed sheets, are disclosed in JP-A-57-124343 (The term "JP-A" as used herein means an "unexamined published Japanese patent application"), JP-A-57-179836 and JP-A-57-197538.

In addition, attempts to extend the spectral sensitivities of those photopolymerizable compositions toward the visible region to thereby form digital images using visible laser as a light source or to apply them to a full color photosensitive material have been made in recent years.

For example, methods of spectrally sensitizing photopolymerizable compositions for the purpose of visible laser recording are described in *Nippon Shashin Gakkaishi*, vol. 49, No. 3, p. 230 (1986) and *Kinoh Zairyo* (which means "Functional Materials"), the September issue, pp. 48-60 (1983). Further, a method of spectrally sensitizing organic peroxides, functioning as polymerization initiator, by organic dyes is disclosed in JP-A-59-189430. Furthermore, organic boron anion salts of organic cationic dyes are used as novel photopolymerization initiators in EP-A1-223587.

In particular, the method of using the organic boron compound anion salts of organic cationic dye compounds as a light-sensitive initiator has an advantage in that the cationic dye compounds can be selected from a wide variety of dyes, and thereby it becomes feasible to design photopolymerization initiator compositions having sensitivity to intended wavelengths of the visible region.

However, the foregoing method, although successful in giving spectral sensitivities to desired wavelengths of the visible spectrum, failed in inducing satisfactorily high sensitivity.

SUMMARY OF THE INVENTION

Therefore, a primary object of the present invention is to provide a novel photopolymerizable composition having high sensitivity and spectral sensitivities to light sources of the wavelengths including the visible and the longer wavelength regions. More specifically, the object of the invention is to provide a composition which uses an organic boron compound anion salt of a novel organic cationic dye as a photopolymerization initiator to gain high sensitivity to light sources of wavelengths including the visible and the longer wavelength regions, e.g., a laser light source, and can be employed to advantage in producing a lithographic printing plate, a resinous relief printing plate, and a resist or photomask for making printed circuit substrates.

We have found out that the above-described object can be attained by employing a photopolymerizable composition which comprises (a) a polymerizable compound having at least one ethylenic unsaturated bond and (b) a salt formed by an organic cationic dye compound, $D\oplus$, represented by formula (II) and an organic boron compound anion, wherein the salt is represented by the following formula (I), with the organic cationic dye compound ($D\oplus$) being represented by the following formula (II):

wherein $D\oplus$ represents a cationic dye, and $R^1$, $R^2$, $R^3$ and $R^4$, which may be the same or different, each represents an alkyl group, an aryl group, an aralkyl group, an alkaryl group, an alkenyl group, an alkinyl group, a alicyclic group, a heterocyclic group, an allyl group, or a group derived therefrom, and two or more of the substituent groups $R^1$ to $R^4$ can combine to form a cyclic structure,

wherein $\phi$ and $\Psi$, which may be the same or different, each represents a heterocyclic ring containing at least one nitrogen atom, and L represents a methine group, or a tri-, penta-, hepta- or nona-methine group formed by linking methine groups one after another by conjugated double bonds, each of which may be substituted, provided that L combines with at least either $\phi$ or $\Psi$ to form a ring.

DETAILED DESCRIPTION OF THE INVENTION

In the formula (I), it is preferred that one or two of the groups represented by $R^1$, $R^2$, $R^3$ and $R^4$ are alkyl groups. $R^1$, $R^2$, $R^3$ and $R^4$ each may have 1 to 20 carbon atoms, and as a typical example, $R^1$ to $R^4$ each has 1 to 7 carbon atoms. More preferably, of the groups represented by $R^1$, $R^2$, $R^3$ and $R^4$, one, two, or three are alkyl groups and the others are aryl groups or aralkyl groups. A combination of three aryl groups and one alkyl group is particularly preferred for the groups represented by $R^1$, $R^2$, $R^3$ and $R^4$.

Specific examples of the alkyl groups represented by $R^1$ to $R^4$ include a methyl group, an ethyl group, a propyl gorup, a butyl group, a pentyl group, a hexyl group, an octyl group, a stearyl group, etc. The alkyl groups may be substituted by one or more substituents (e.g., a halogen atom, a cyano group, an acyloxy group, an acyl group, an alkoxy group, or a hydroxy group).

Specific examples of the aryl groups represented by $R^1$ to $R^4$ include a phenyl group, a naphthyl group, a substituted aryl group (including an anisyl group and an alkylaryl group such as methylphenyl and dimethylphenyl).

Specific examples of the aralkyl group represented by $R^1$ to $R^4$ include a benzyl group. Specific examples of the alicyclic groups include a cyclobutyl group, a cyclopentyl group and a cyclohexyl group. Specific examples of the alkynyl group include a propynyl group and an ethynyl group, and specific examples of the alkenyl groups include a vinyl group.

Heterocyclic rings represented by $\phi$ and $\Psi$ in the formula (II) may be the same or different. However, the case where $\phi$ and $\Psi$ represent the same heterocyclic ring is preferred because of the facility in synthesis.

In the formula (II), at least one nitrogen atom in the heterocyclic ring $\phi$ is situated in such a position as to conjugate with at least one nitrogen atom in the heterocyclic ring $\Psi$ through a linkage group L. Therefore, the formula (II) can also be represented by the following formula (IIa). In the present specification, however, hybridization of these resonanting structures is represented by the formula (II) for convenience' sake:

$$\phi = L - \Psi \oplus \qquad (IIa)$$

wherein $\phi$, $\Psi$, and L have the same meanings as for formula (II).

Preferred examples of the heterocyclic rings represented by $\phi$ or $\Psi$ in the formula (II) include 3H-indole rings, thiazole rings, oxazole rings, selenazole rings, tellurazole rings, imidazole rings, pyridine rings, quinoline rings and isoquinoline rings. These rings each may form a condensed ring by being fused together with a benzene ring, a naphthalene ring, a phenanthrene ring or a 5- to 7-membered heterocyclic ring, or each may have a substituent group.

Particularly preferred heterocyclic rings among those represented by $\phi$ or $\Psi$ are represented by the following formulae $\phi 1$ to $\phi XVI$. Each formula is represented by its corresponding structure bearing the positive charge.

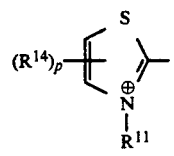
$\phi I$

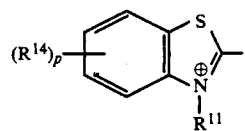
$\phi II$

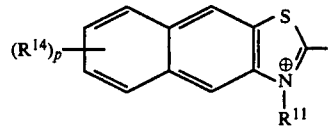
$\phi III$

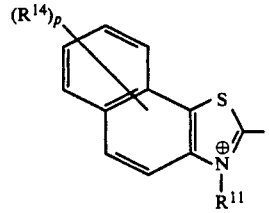
$\phi IV$

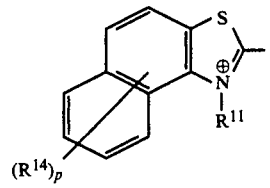
$\phi V$

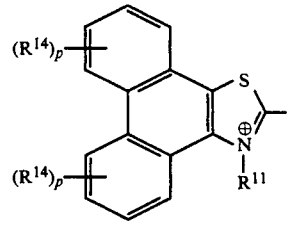
$\phi VI$

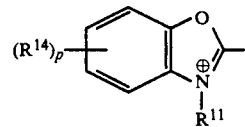
$\phi VII$

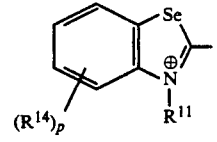
$\phi VIII$

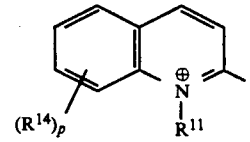
$\phi IX$

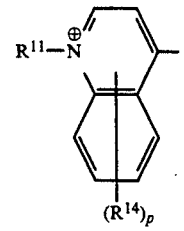
$\phi X$

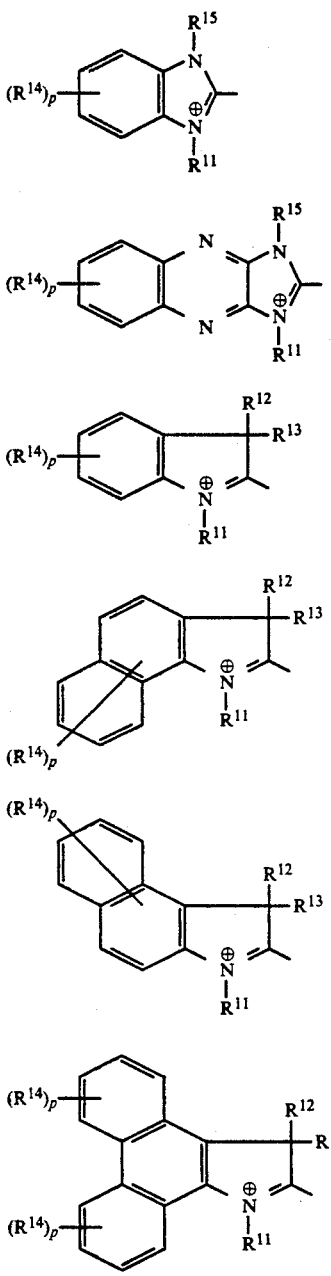

The group represented by $R^{11}$ or $R^{15}$ in the heterocyclic rings of the formula $\phi1$ to $\phi XVI$ is a substituted or unsubstituted alkyl, aryl or alkenyl group, particularly preferably an alkyl group. However, when $R^{11}$ or $R^{15}$ combines with L to form a ring, it corresponds to a divalent linkage group represented by Z described hereinafter. The number of carbon atoms contained in the group represented by $R^{11}$ or $R^{15}$ is preferably from 1 to 30, particularly preferably from 1 to 20.

As examples of substituent groups by which the foregoing groups may be further substituted, mention may be made of an alkylcarbonyloxy group, an alkylamido group, an alkylsulfonamido group, an alkoxycarbonyl group, an alkylamino group, an alkylcarbamoyl group, an alkylsulfamoyl group, an alkoxy group, an aryloxy group, an alkylthio group, an arylthio group, an alkyl group, an aryl group, a halogen atom, a cyano group, and so on. Among these groups, halogen atoms (e.g., F, Cl), cyano groups, alkoxy groups containing from 1 to 20 carbon atoms (e.g., methoxy, ethoxy, dodecyloxy, methoxyethoxy), unsubstituted or substituted phenoxy groups containing from 6 to 20 carbon atoms (e.g., phenoxy, 3,5-dichlorophenoxy, 2,4-di-t-pentylphenoxy), unsubstituted or substituted alkyl groups containing from 1 to 20 carbon atoms (e.g., methyl, ethyl, isobutyl, t-pentyl, octadecyl, cyclohexyl), and unsubstituted or substituted phenyl groups (e.g., phenyl, 4-methyl-phyenyl, 4-trifluoromethylphenyl, 3,5-dichlorophenyl) are preferred.

Particularly preferred groups among those represented by $R^{11}$ or $R^{15}$ are unsubstituted alkyl groups containing from 1 to 8 carbon atoms when they are not connected to L, while when connected to L they are groups represented by Z described hereinafter.

When the rings represented by $\phi$ or $\Psi$ are condensed or noncondensed indolenine rings (as illustrated in the formulae $\phi XIII$ to $\phi XVI$), substituent groups represented by $R^{12}$ or $R^{13}$ include unsubstituted or substituted alkyl groups (containing preferably from 1 to 20 carbon atoms) and unsubstituted or substituted aryl groups (preferably unsubstituted or substituted phenyl groups containing from 6 to 20 carbon atoms). Among the groups represented by $R^{12}$ and $R^{13}$, a methyl group is particularly preferred over others.

In addition, another substituent represented by $R^{14}$ may be present in prescribed positions on the rings represented by $\phi$ and $\Psi$. Suitable examples of such substituent groups include an alkyl group, an aryl group, a heterocyclic ring residual group, a halogen atom, an alkoxy group, an aryloxy group, an alkylthio group, an arylthio group, an alkylcarbonyl group, an arylcarbonyl group, an alkyloxycarbonyl group, an aryloxycarbonyl group, an alkylcarbonyloxy group, an arylcarbonyloxy group, an alkylamido group, an arylamido group, an alkylcarbamoyl group, an arylcarbamoyl group, an alkylamino group, an arylamino group, an alkylsulfonyl group, an arylsulfonyl group, an alkylsulfonamido group, an arylsulfonamido group, an alkylsulfamoyl group, an arylsulfamoyl group, a cyano group, a nitro group, and so on.

The number of these substituent groups represented by $R^{14}$ (p) is generally 0, or of the order of from 1 to 4. When p is 2 or more, plural $R^{14}$'s may be the same or different from each other.

Preferred examples of substituent groups represented by $R^{14}$ include halogen atoms (e.g., F, Cl), a cyano group, alkoxy groups containing from 1 to 20 carbon atoms (e.g., methoxy, ethoxy, dodecyloxy, methoxyethoxy), unsubstituted or substituted phenoxy groups containing from 6 to 20 carbon atoms (e.g., phenoxy, 3,5-dichlorophenoxy, 2,4-di-t-pentylphenoxy), unsubstituted or substituted alkyl groups containing from 1 to 20 carbon atoms (e.g., methyl, ethyl, isobutyl, t-pentyl, octadecyl, cyclohexyl, trifluoromethyl), and unsubstituted or substituted phenyl groups containing from 6 to 20 carbon atoms (e.g., phenyl, 4-methylphenyl, 4-trifluoromethylphenyl, 3,5-dichlorophenyl). Among these groups, particularly preferred ones as $R^{14}$ are halogen atoms (e.g., F, Cl), a cyano group, alkyl groups containing from 1 to 4 carbon atoms, a phenyl group, and the alkyl or phenyl groups substituted by one or more of a substituent having a positive Hammett's $\delta_m$ (sigma meta) constant (e.g., 2-chloroethyl, trifluoromethyl, 2-methoxyethyl, 4-chlorophenyl, 2-phenylsulfonylethyl).

Particularly preferred heterocyclic rings among those represented by the formulae φXIII to φXVI are the rings represented by the following formula (φXVII), which belongs to the formula φXIII and correspond to the case wherein $R^{12}$ and $R^{13}$ are both methyl groups, $R^{14}$ is Cl and the ring can be connected to L via $R^{11}$.

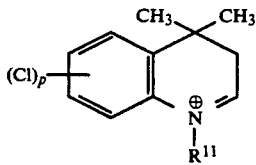

(φXVII)

As described hereinbefore, the group represented by L in the general formula (II) is an optionally substituted methine group, or a group formed by connecting such methine groups to one another through conjugated double bonds, including a trimethine group, a pentamethine group, a heptamethine group and a nonamethine group. Among these groups, those represented by the following formulae (LI) to (LIX) are preferred over others.

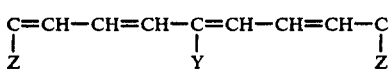 (LI)

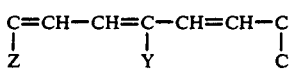 (LII)

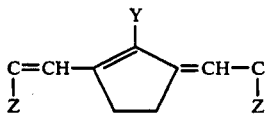 (LIII)

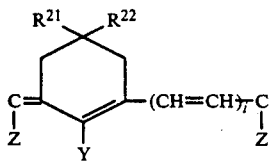 (LIV)

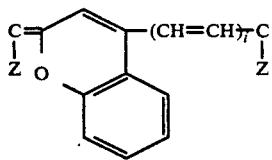 (LV)

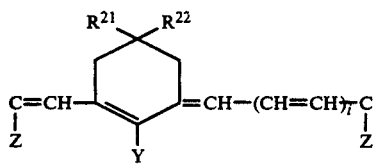 (LVI)

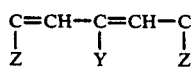 (LVII)

 (LVIII)

$$\begin{array}{c} C \\ | \\ Z \end{array}$$ (LIX)

In the above formulae (LI) to (LIX), i represents 0 or 1, Z represents a hydrogen atom or a divalent group for completing a ring by combining with φ or Ψ, and Y represents a hydrogen atom or a monovalent group.

Preferred examples of rings completed by a divalent group represented by Z include 5-, 6- or 7-membered carbon or heterocyclic rings, especially those formed by connecting Z to a nitrogen atom contained in φ or Ψ. Accordingly, those preferred as a divalent group represented by Z include an ethylene group, a propylene group, a butylene group, and groups formed by replacing a methylene moiety of these groups, other than those attached directly to L or Z, which may have a substituent, by —O— or —S—. Among these groups, an ethylene group, a propylene group, a butylene group, —$CH_2OCH_2$—, —$CH_2OCH_2CH_2$—, —$CH_2SCH_2$— and —$CH_2SCH_2CH_2$—, each of which may be substituted, are particularly favored as the divalent group of Z. As examples of substituents which the foregoing groups may have, mention may be made of halogen atoms such as F and Cl, a nitro group, a cyano group, unsubstituted or substituted alkyl groups containing from 1 to 20 carbon atoms (e.g., methyl, ethyl, trifluoromethyl, 2-methoxyethyl, cyclohexyl, benzyl), a phenyl group, substituted phenyl groups containing from 6 to 20 carbon atoms (e.g., p-methoxyphenyl, m-chlorophenyl, p-toluyl, p-fluorophenyl), unsubstituted or substituted alkoxy groups containing from 1 to 20 carbon atoms (e.g., methoxy, 2-methoxyethoxy, 2,2,3,3-tetrafluoropropyloxy), a phenoxy group, substituted phenoxy groups containing from 6 to 20 carbon atoms (e.g., p-methoxyphenoxy, 3,5-dichlorophenoxy, p-butylphenoxy), alkylthio groups containing from 1 to 20 carbon atoms (e.g., methylthio, butylthio, dodecylthio), arylthio groups containing from 6 to 20 carbon atoms (e.g., phenylthio), alkylsulfonyl groups containing from 1 to 20 carbon atoms (e.g., methanesulfonyl, butanesulfonyl, dodecanesulfonyl), arylsulfonyl groups containing from 6 to 20 carbon atoms (e.g., phenylsulfonyl, p-toluenesulfonyl, m-chlorobenzenesulfonyl), and so on.

Especially preferred divalent groups among those represented by Z are an ethylene group, a propylene group, a butylene group, and groups formed by replacing one or more of a hydrogen atom in the foregoing groups by one or more of a substituent selected from among F, Cl and alkyl groups containing from 1 to 4 carbon atoms.

Suitable examples of a monovalent group represented by Y include lower alkyl groups (containing from 1 to 12 carbon atoms) such as methyl, etc., lower alkoxy groups (containing from 1 to 12 carbon atoms) such as methoxy, etc., substituted amino groups such as dimethylamino, diphenylamino, methylphenylamino, morpholino, imidazolidinyl, ethoxycabonylpiperazinyl, etc., alkylcarbonyloxy groups such as acetoxy, etc., alkylthio groups such as methylthio, etc., a cyano group, a nitro group, and halogen atoms such as Br, Cl, F, etc. Y preferably is a hydrogen atom.

$R^{21}$ and $R^{22}$ each represents a hydrogen atom or an alkyl group containing from 1 to 12 carbon atoms such as methyl, etc.

Specific examples of the compound represented by the formula (II) are illustrated below. However, the scope of the invention should not be construed as being limited to these exemplified compounds.
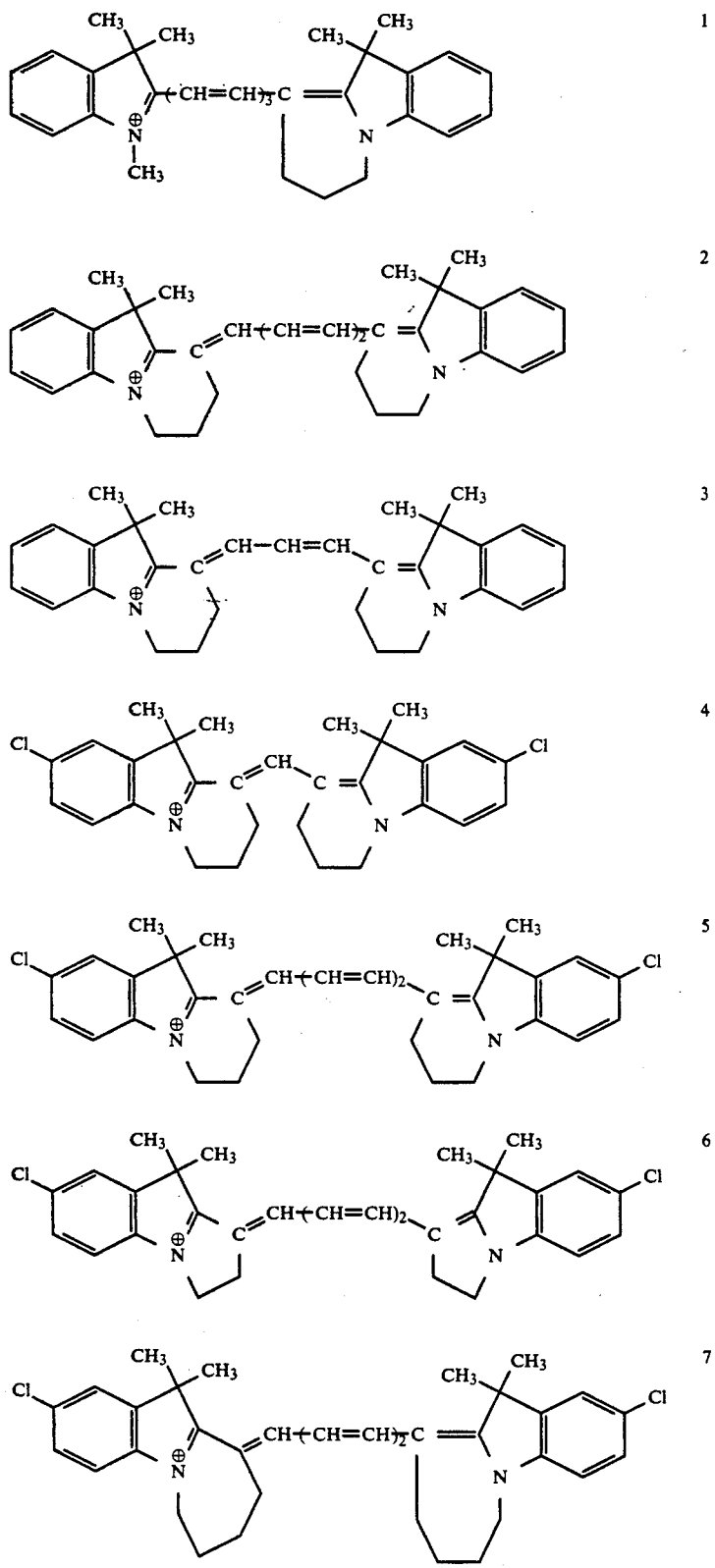

-continued
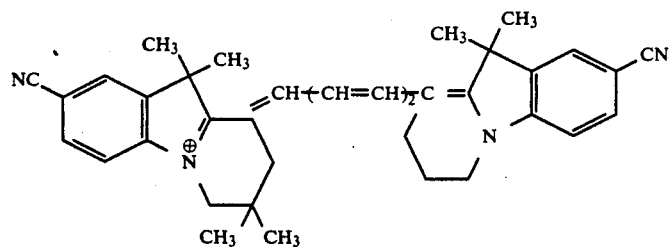
8
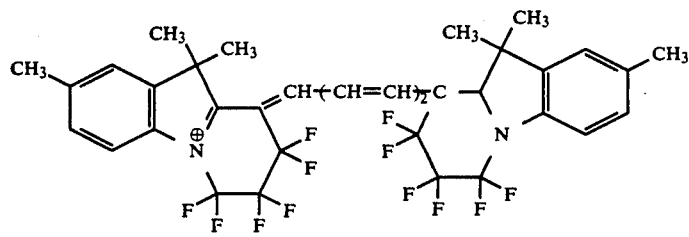
9
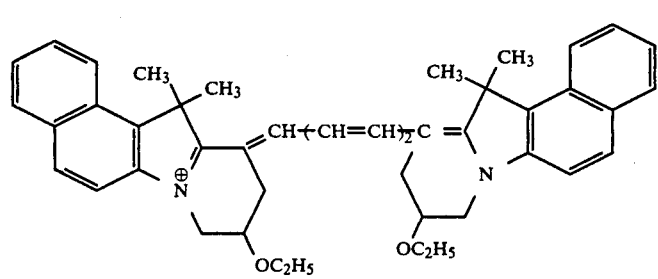
10
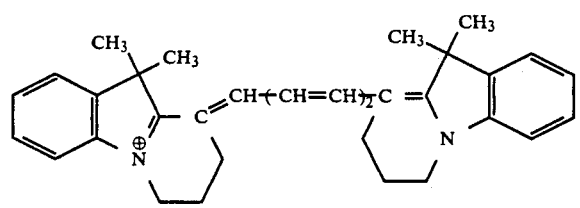
11
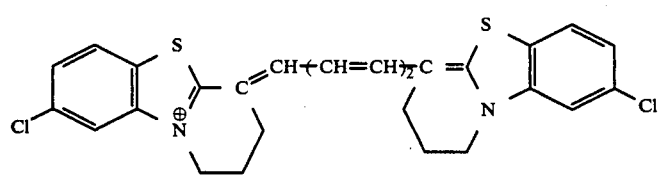
12
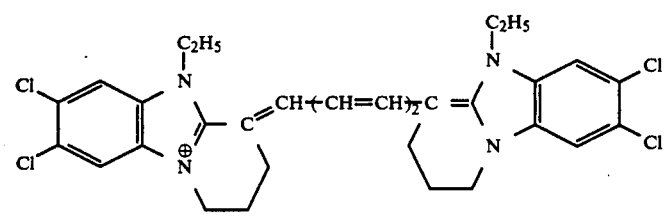
13
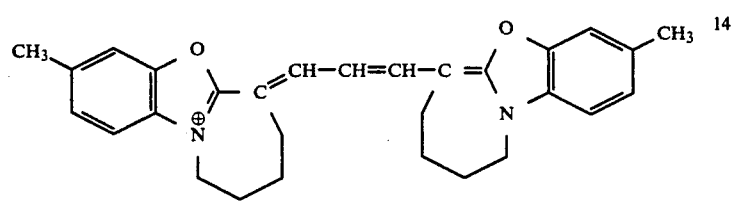
14

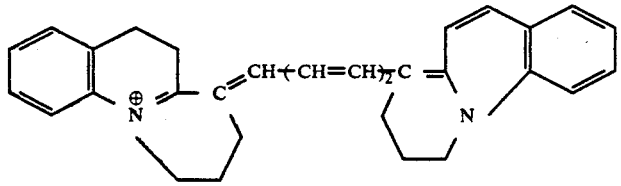

15

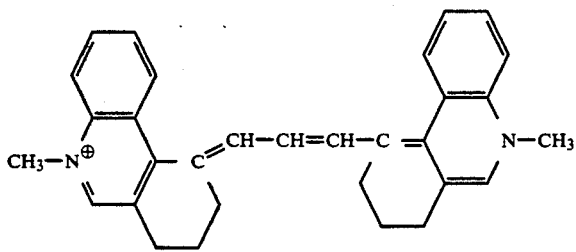

16

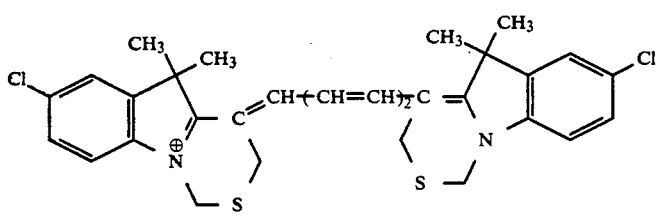

17

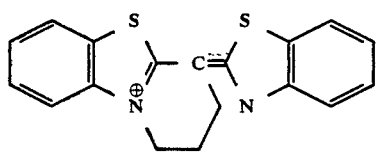

18

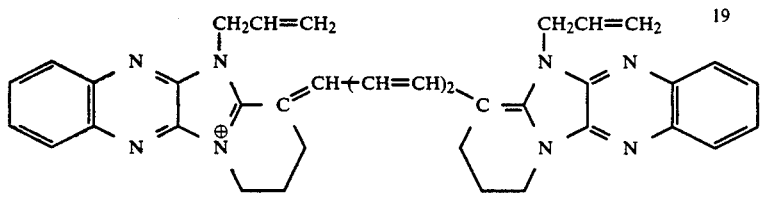

19

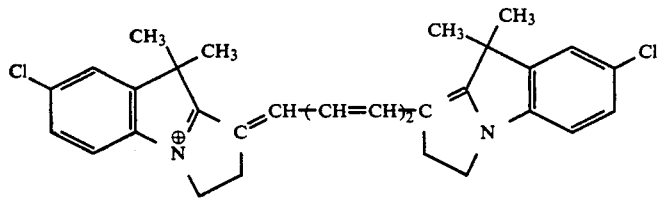

20

As for the organic boron compound anion in the formula (I), many different ones can be used by reference to U.S. Pat. Nos. 3,567,453, 4,307,182, 4,343,891, 4,447,521 and 4,450,227, JP-A-62-150242, JP-A-62-143044, and so on. In the most preferred compounds, $R^1=R^2=R^3=$phenyl, p-methoxyphenyl, p-butoxyphenyl, p-dimethylaminophenyl or p-chlorophenyl, and $R^4=$methyl, ethyl, propyl, butyl, n-hexyl, n-heptyl or benzyl.

Although it goes without saying that organic boron compound anion salts of organic cation dyes prepared by reference, e.g., to the above-cited patents can be used as the boron compound of the formula (I), an arbitrary salt of an organic cationic dye, e.g., a chloride, an iodide, etc., and an arbitrary salt of an organic boron compound, such as a tetrabutylammonium salt, may be added independently to the photopolymerizable composition.

The polymerizable compound having at least one ethylenic unsaturated bond, which is an essential constituent of the composition of the present invention, is intended to include, such as a monomer, a prepolymer such as a dimer, a trimer or another oligomer, a mixture thereof, a copolymer, or the like. As examples of such a polymerizable compound, mention may be made of unsaturated carboxylic acids, their salts, their esters of aliphatic polyhydric alcohols, their amides of aliphatic polyamine compounds, and so on.

Specific examples of unsaturated carboxylic acids include acrylic acid, methacrylic acid, itaconic acid, crotonic acid, isocrotonic acid, maleic acid, and so on.

Specific examples of salts of unsaturated carboxylic acids include sodium salts and potassium salts of the foregoing acids.

Specific examples of esters of aliphatic polyhydric alcohol compounds and unsaturated carboxylic acids include acrylic acid esters such as ethylene glycol diacrylate, triethylene glycol triacrylate, 1,3-butanediol diacrylate, tetramethylene glycol diacrylate, propylene glycol diacrylate, trimethylolpropane triacrylate, trimethylolethane triacrylate, 1,4-cyclohexane-diol diacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, sorbitol triacrylate, sorbitol tetra-acrylate, sorbitol pentaacrylate, sorbitol hexaacrylate, polyester acrylate oligomers, etc.; methacrylic acid esters such as tetramethylene glycol dimethacrylate, triethylene glycol dimethacrylate, trimethylolpropane trimethacrylate, trimethylolethane trimethacrylate, ethylene glycol dimethacrylate, 1,3-butanediol dimethacrylate, pentaerythritol dimethacrylate, pantaerythritol trimethacrylate, dipentaerythritol dimethacrylate, sorbitol trimethacrylate, sorbitol tetramethacrylate, bis-[p-(3-methacryloxy-2-hydroxypropoxy)phenyl]dimethylmethane, bis-[p-(acryloxyethoxy)phenyl]dimethylmethane, etc.; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, etc.; crotonic acid esters such as ethylene glycol dicrotonate, tetramethylene glycol dicrotonate, pentaerythritol dicrotonate, sorbitol tetracrotonate, etc.; isocrotonic acid esters such as ethylene glycol diisocrotonate, pentaerythritol diisocrotonate, sorbitol tetraisocrotonate, etc.; and maleic acid esters such as ethylene glycol dimaleate, triethylene glycol dimaleate, pentaerythritol dimaleate, sorbitol tetramaleate, etc. In addition, mixtures of two or more of the above-cited esters can be used.

Specific examples of amides of aliphatic polyamines and unsaturated carboxylic acids include hexamethylenebis-acrylamide, 1,6-hexamethylenebismethacrylamide, diethylenetriamine trisacrylamide, xylylenebisacrylamide, xylylenebismethacrylamide, and the like.

As other examples of the polymerizable compounds, mention may be made of vinylurethane compounds which have two or more of polymerizable vinyl groups in a molecule and are prepared by addition of hydroxyl group-containing vinyl monomers represented by the following formula (III) to polyisocyanate compounds containing two or more of isocyanate groups in a molecule, as described in JP-B-48-41708 (The term "JP-B" as used herein means an "examined Japanese patent publication"):

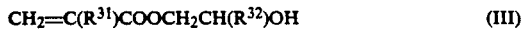

$$CH_2=C(R^{31})COOCH_2CH(R^{32})OH \quad (III)$$

wherein $R^{31}$ and $R^{32}$, which may be the same or different, each represents H or $CH_3$.

Also, high molecular weight compounds containing vinyl or vinylidene groups, e.g., condensates of high molecular weight compounds containing hydroxyl groups, amino groups, epoxy groups, halogen atoms or sulfonyloxy groups in their side chains and acrylic acid, methacrylic acid or derivatives thereof, can be used in the present invention.

Further, color image-forming substances, e.g., compounds prepared by introducing one or more of a vinyl group into a dye or leuco dye molecule, can be utilized as the polymerizable compound.

It is desirable that the salt formed by an organic boron compound anion and an organic cationic dye compound be added in a proportion of from about 0.01 to about 50 wt % to the polymerizable compound.

Novel photopolymerizable compositions comprising such ethylenic unsaturated bond-containing polymerizable compounds and salts formed by an organic boron compound anion and an organic cationic dye compound as exemplified above can be used in various ways.

For instance, the photopolymerizable compositions coated on supports together with binder polymers can be applied to resist materials for making printing plates and printed circuit substrates by reference to U.S. Pat. Nos. 4,604,342, 4,587,199, 4,629,680, 4,415,652, 4,431,723 and 4,550,073, JP-A-61-285444, JP-A-61-213213 and so on, to color proof materials by reference to JP-A-62-67529, U.S. Pat. No. 4,604,340, and so on, and to many fields according to known methods.

Moreover, the photopolymerizable composition of the present invention can be used to greater advantage in producing image-forming systems utilizing microcapsules, because it has high sensitivity even in the visible region.

In applying the present composition to image-forming systems utilizing microcapsules, JP-A-57-197538, U.S. Pat. Nos. 4,587,194, 4,399,209, and 4,440,846, EP-A1-223587 and so on can be referred to. The image formation in such systems can be effected, e.g., according to a process which comprises forming a light-sensitive sheet by coating on a support microcapsules enclosing a dye precursor and a photopolymerizable composition comprising an ethylenic vinyl compound and a photopolymerization initiator, subjecting the light-sensitive sheet to imagewise exposure to harden the exposed microcapsules, and applying pressure to the whole surface of the light-sensitive sheet superposed on a color developer sheet, thereby rupturing the unexposed microcapsules and transferring the color image-forming substance (e.g., a dye precursor) into an image-receiving element (e.g., a color developer layer) to achieve color development.

Now, the present invention is illustrated citing the image-forming systems utilizing microcapsules as an example.

To the photopolymerizable composition of the present invention, various kinds of additives can be added depending on the intended use. For example, a thermal polymerization inhibitor, a polymerization accelerator, image-forming substances (dyes, dye precursors, or pigments) and so on can be added.

Methods of producing light-sensitive materials utilizing the photopolymerizable composition of the present invention are described below.

Various methods can be employed for the production of the light-sensitive materials, and a general method comprises the steps of preparing coating compositions by dissolving, emulsifying or dispersing ingredients to constitute a light-sensitive layer into proper solvents, coating the compositions on a support, and drying the coat(s).

In general, each of the above-described coating compositions is prepared by firstly preparing each of liquid compositions containing individual ingredients, and then mixing these liquid compositions. These liquid compositions may be prepared for each ingredient, or so as to contain two or more of ingredients together. Some of the ingredients to constitute the light-sensitive layer can be added during or after the preparation of the foregoing liquid composition or coating composition. Further, as described hereinafter, a method of preparing a secondary composition by emulsifying an oily (or aqueous) composition containing one or more of an ingredient into an aqueous (or oily) solvent can be employed.

A polymerizable compound in the photopolymerizable composition of the present invention can be incorporated in a light-sensitive layer in the form of emulsion droplets, and the droplets can be enclosed with microcapsule wall. Therein, it is to be desired that the salt formed by the organic boron compound anion and the organic cationic dye compound also should be contained in the droplets.

To the composition of the present invention, a thermal polymerization inhibitor can be further added mainly for the purpose of inhibiting the thermal polymerization of the photopolymerizable composition during storage. Specific examples of the thermal polymerization inhibitor include p-methoxyphenol, hydroquinone, alkyl- or aryl-substituted hydroquinones, t-butyl-catechol, pyrogallol, cuprous chloride, chloranil, naphthylamine, $\beta$-naphthol, 2,6-di-t-butyl-p-cresol, pyridine, nitrobenzene, dinitrobenzene, p-toluidine, methylene blue organocopper, methyl salicylate, and so on. These thermal polymerization inhibitors each are preferably used in an amount of from 0.001 to 5 parts by weight per 100 parts by weight of ethylenic unsaturated compound.

As a polymerization accelerator which can be further added to the composition of the present invention, a reducing agent, e.g., an oxygen scavenger or a compound that functions as a chain transfer agent of an active hydrogen donor, can be used in combination with a compound containing an —SH group in the molecule. Specific examples of oxygen scavengers which have been found to be useful include phosphines, phosphonates, phosphites, stannous salts, and other compounds which can be easily oxidized with oxygen. Useful examples of chain transfer agents include N-phenylglycine, trimethyl barbituric acid, 2-mercaptobenzoxazole, 2-mercaptobenzothiazole, N,N-dimethyl-2,6-diisopropylaniline, N,N-2,4,6-pentamethylaniline, and other compounds having hydrogen that can be easily extracted with a radical.

A color image-forming substance can be incorporated into the composition of the present invention, and thereby the polymerized part can be colored after removal of the unpolymerized part, or a color image can be formed in an image-receiving element into which the unpolymerized part is transferred.

A wide variety of color image-forming substances can be used in the present invention. For instance, dyes and pigments can be cited as materials which are colored in themselves. When these materials are used, the part (the microcapsules) in which high molecular weight polymers have not been produced is destroyed, and the materials are transferred into an image-receiving material using an appropriate means to result in the formation of color images. As for the dyes and pigments, not only commercially available ones but also other known dyes and pigments, e.g., as described in various literature [such as *Senryo Binran* (which means "handbook of dyes"), compiled by Yukigosei Kagaku Kyokai and published in 1970, and *Seishin Ganryo Binran* (which means "the newest handbook of pigments"), compiled by Nippon Ganryo Gijutsu Kyokai and published in 1977], can be utilized. These dyes and pigments are used in the form of a solution or a dispersion.

On the other hand, color image-forming colorless substances are divided into two groups. One group consists of substances which, although themselves are colorless or only lightly colored, develop their colors by the application of some energy, e.g., heat, pressure, light and so on. The other group consists of substances which, although themselves do not develop their colors by the application of any energy, develop their colors by contact with another component. As examples of substances belonging to the former group, there are known thermochromic compounds, piezochromic compounds, photochromic compound, and leuco bodies such as triarylmethane dyes, quinone dyes, indigoide dyes, azine dyes and so on. Each of these compounds develops its color by the application of heat or pressure, irradiation with light, or air oxidation.

Examples of the latter group include various kinds of systems comprising two or more components among which such a reaction as an acid-base reaction, a reduction-oxidation reaction, a coupling reaction or a chelate-forming reaction takes place to produce a color. More specifically, there can be utilized a color-producing system as is used for pressure-sensitive paper, which comprises a color former having such a partial structure as a lactone, lactam, spiropyran or the like, and an acidic substance (a color developer) such as acid clay, phenols or the like; a system utilizing the azo coupling reaction between an aromatic diazonium salt, diazotate or diazosulfonate, and naphthols, anilines, active methylenes or the like; and chelate-forming systems utilizing the reaction of hexamethylenetetraamine with ferric ion and gallic acid, the reaction between phenolphtalein-Complexon and an alkaline earth metal ion, and so on; redox reactions such as the reaction between ferric stearate and pyrogallol, the reaction of silver behenate and 4-methoxy-1-naphthol, and so on.

As examples of another system in which color can be developed by a reaction between two components, cases in which heating is required for bringing about the reaction are known. In these cases, it is necessary to heat the system simultaneously with or just after the two-component mixing caused by rupture of microcapsules upon application of pressure.

As examples of a color former in the color former/color developer system, mention may be made of (1) triarylmethane compounds, (2) diphenylmethane compounds, (3) xanthene compounds, (4) thiazine compounds and (5) spiropyran compounds. Specific examples of these compounds include those described in U.S. Pat. No. 4,283,458 and so on. Among these compounds, color formers of (1) triarylmethane type and (3) xanthene type are favored over others, because most of these can provide low density of fog and high density of developed color. Specific examples of color formers of such types include Crystal Violet lactone, 3-diethylamino-6-chloro-7-($\beta$-ethoxyethylamino)fluoran, 3-diethylamino-6-methyl-7-anilinofluoran, 3-triethylamino-6-methyl-7-anilinofluoran, 3-cyclohexylmethylamino-6-methyl-7-anilinofluoran, 3-diethylamino-7-o-chloroanilinofluoran, and so on. These compounds may be used alone or as a mixture of two or more.

As for the color developer, phenolic compounds, organic acids or metal salts thereof, oxybenzoic acid esters, acid clay and so on can be employed.

Specific examples of phenol compounds include 4,4'-iso-propylidene-diphenol (bisphenol A), p-tertbutylphenol, 2,4-dinitrophenol, 3,4-dichlorophenol, 4,4'-methylene-bis(2,6-di-tert-butylphenol), p-phenylphenol, 1,1-bis(4-hydroxyphenyl)-cyclohexane, 1,1-bis(4-hydroxyphenyl)-2-ethylhexane, 2,2-bis(4-hydroxyphenyl)butane, 2,2'-methylenebis(4-tert-butylphenol), 2,2'-methylenebis(α-phenyl-p-cresol)thiodiphenol, 4,4'-thiobis(6-tertbutyl-m-cresol), sulfonyldiphenol, p-tertbutylphenol/formaldehyde condensate, p-phenylphenol/formaldehyde condensate, and the like.

Useful examples of organic acids and their metal salts include phthalic acid, phthalic anhydride, maleic acid, benzoic acid, gallic acid, o-toluic acid, p-toluic acid, salicylic acid, 3-tert-butylsalicylic acid, 3,5-ditert-butylsalicylic acid, 5-α-methylbenzylsali-cylic acid, 3,5-(α-methylbenzyl)salicylic acid, 3-tert-octylsalicylic acid, and zinc, lead, aluminium, magnesium and nickel salts of these acids. In particular, salicylic acid derivatives, and zinc and aluminium salts thereof are superior to other in color developability, fastness of the developed color images, storability of the recording sheets using them, and so on.

Specific examples of oxybenzoic acid esters include ethyl p-oxybenzoate, butyl p-oxybenzoate, heptyl p-oxybenzoate, benzyl p-oxybenzoate, and the like.

On the other hand, diffusion and fixation of components enclosed in microcapsules can be designed by combined use with an oil-absorbing white pigment.

In order to fuse such a color developer as described above at an intended temperature to thereby to make the color development proceed, it is desirable that the color developer should be added as an eutectic mixture with a heat-fusible substance having a low melting point, or in such a condition that a low melting compound is fused on the individual surfaces of the color developer particles and stuck thereto.

Specific examples of low melting compounds include higher fatty acid amides such as stearic acid amide, erucic acid amide, palmitic acid amide, ethylenebisstearoamide, etc., waxes such as higher fatty acid esters, etc., phenyl benzoate derivatives, aromatic ether derivatives, and urea derivatives. However, low melting compounds other than the above-cited ones can also be used in the present invention.

As for the color formers to be used in another color former/color developer system, phenolphthalein, fluorescein, 2',4',5',7'-tetrabromo-3,4,5,6-tetrachlorofluorescein, Tetrabromophenol Blue, 4,5,6,7-tetrabromophenolphthalein, Eosine, Aurin Cresol Red, 2-naphtholphenolphthalein and so on can be mentioned.

Color developers suitable for the combined use with the above-cited color formers are nitrogen-containing compounds, such as inorganic and organic ammonium salts, organic amines, amides, urea and thiourea and their derivatives, thiazoles, pyrroles, pyrimidines, piperazines, guanidines, indoles, imidazoles, imidazolines, triazoles, morpholines, piperidines, amidines, formazines, pyridines, and the like. Specific examples of these compounds include ammonium acetate, tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methyl-imidazole, 2-undecylimidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-ditolylguanidine, 1,2-dicyclohexylguanidine, 1,2-dicyclohexyl-3-phenylguanidine, 1,2,3-tricyclohexylguanidine, guanidine trichloroacetate, N,N'-dibenzylpiperazine, 4,4'-dithiomorpholine, morpholinium trichloroacetate, 2-amino-benzothiazole, and 2-benzoylhydrazino-benzothiazole.

The color image-forming substance can be used in the present invention, in an amount of from about 0.5 to about 20 parts by weight, particularly preferably from about 2 to about 7 parts by weight, per 100 parts by weight of the polymerizable compound. The color developer is used in an amount of from about 0.3 to about 80 parts by weight per 1 parts by weight of the color former.

In microencapsulating the photopolymerizable composition of the present invention, methods well-known to those skilled in the art can be employed. For instance, methods of utilizing the coacervation of hydrophilic wall-forming materials, as described in U.S. Pat. Nos. 2,800,457 and 2,800,458; interfacial polymerization methods as described in U.S. Pat. No. 3,287,154, British Patent 990,443, JP-B-38-19574, JP-B-42-446, and JP-B-42-771; methods of utilizing the deposition of polymers as described in U.S. Pat. Nos. 3,418,250 and 3,660,304; methods of using isocyanatepolyol wall materials as described in U.S. Pat. No. 3,796,669; methods using isocyanate wall materials as described in U.S. Pat. No. 3,914,511; methods of using the wall materials of urea-formaldehyde type or urea-formaldehyde-resorcinol type as described in U.S. Pat. Nos. 4,001,140, 4,087,376 and 4,089,802; methods of using wall forming materials such as melamine-formaldehyde resin, hydroxypropyl cellulose and the like as described in U.S. Pat. No. 4,025,455; the in situ method for polymerization of monomers as described in JP-B-36 9168 and U.S. Pat. No. 4,001,140; the electrolytic dispersing and cooling method as described in British Patents 952,807 and 965,074; and spray drying methods as described in U.S. Pat. No. 3,111,407 and British Patent 930,422 can be cited. Although the microencapsulation methods to be used in the present invention should not be construed as being limited to the above-cited ones, it is desirable that a polymer film as a microcapsule wall should be formed after the emulsification of a core material.

In particular, when a microcapsule wall is formed by a microencapsulation method which involves the polymerization of reactants supplied from the inside of individual oil dkroplets, great effects can be achieved. That is, capsules suitable for a recording material in respect that they have a uniform size and excellent freshness or storage stability can be obtained in a short time.

For instance, in the case of using polyurethane as a microcapsule wall material, the microcapsule wall is formed in the following manner: A polyisocyante and a second substance to react therewith (e.g., polyol, polyamine) are mixed with an oily liquid to be microencapsulated, the resulting mixture is emulsified and dispersed in water, and then the temperature of the resulting dispersion is raised to bring about the polymer forming reaction at the individual oil droplet surfaces. Therein, an auxiliary solvent having a low boiling point and strong dissolving power can be used in the oily liquid.

Polyisocyanates and their fellow reactants, e.g., polyols or polyamines, as disclosed in U.S. Pat. Nos. 3,281,383, 3,723,363, 3,773,695, 3,793,268, and 3,838,108, JP-B-48-40347, and JP-A-48-84086 can also be used in the above-described capsule wall formation.

Specific examples of polyisocyanates include diisocyanates such as m-phenylenediisocyanate, p-phenylenediisocyanate, 2,6-tolylenediisocyanate, 2,4-tolylenediisocyanate, naphthalene-1,4-diisocyanate, diphenylmethane-4,4'-diisocyanate, 3,3'-dimethoxy-4,4'-biphenyl-diisocyanate, 3,3'-dimethyldiphenylmethane-4,4'diisocyanate, xylylene-1,4-diisocyanate, 4,4'-diphenylpropanediisocyanate, trimethylenediisocyanate, hexamethylenediisocyanate, propylene-1,2-diisocyanate, butylene-1,2-diisocyanate, cyclohexylene-1,2-diisocyanate, cyclohexylene-1,4-diisocyanate and the like; triisocyanates such as 4,4',4"-triphenylmethanetriisocyanate, toluene-2,4,6-triisocyanate and the like; tetraisocyanates such as 4,4'-dimethyldiphenylmethane-2,2',5,5'-tetraisocyanate; and isocyanate prepolymers such as an adduct of hexamethylenediisocyanate and trimethylolpropane, an adduct of 2,4-tolylenediisocyanate and trimethylolpropane, an adduct of xylylenediisocyanate and trimethylolpropane, an adduct of tolylenediisocyanate and hexanetriol, and so on.

As examples of polyols, mention may be made of aliphatic and aromatic polyhydric alcohols, hydroxypolyesters, hydroxypolyalkylene ethers, and so on.

In addition, polyols as described in U.S. Pat. No. 4,650,740 can also be used. Specifically, they include ethylene glycol, 1,3-propanediol, 1,4-butanediol, 1,5-pentanediol, 1,6-hexanediol, 1,7-heptanediol, 1,8-octanediol, propylene glycol, 2,3-dihydroxybutane, 1,2-dihydroxybutane, 1,3-dihydroxybutane, 2,2-dimethyl-1,3-propanediol, 2,4-pentanediol, 2,5-hexanediol, 3-methyl-1,5-pentanediol, 1,4-cyclohexanedimethanol, dihydroxycyclohexane, diethylene glycol, 1,2,6-trihydroxyhexane, 2-phenylpropylene glycol, 1,1,1-trimethylolpropane, hexanetriol, pentaerythritol, an adduct of pentaerythritol and ethylene oxide, an adduct of glycerin and ethylene oxide, glycerin, 1,4-di(2-hydroxyethoxy)benzene, condensation products of aromatic polyhydric alcohols and alkylene oxides (e.g., resorcinol dihydroxyethyl ether), p-xylylene glycol. m-xylylene glycol, $\alpha$, $\alpha'$-dihydroxy-p-diisopropylbenzene, 4,4'-dihydroxy-diphenylmethane, 2-(p,p'-dihydroxydiphenylmethyl)benzyl alcohol, an adduct of bisphenol A and ethylene oxide, an adduct of bisphenol A and propylene oxide, and so on. Such a polyol as described above is preferably used in an amount of from about 0.02 to about 2 moles, based on hydroxyl group, per 1 mole of isocyanate group.

Suitable examples of polyamines include ethylenediamine, trimethylenediamine, tetramethylenediamine, pentamethylenediamine, hexamethylenediamine, p-phenylenediamine, m-phenylenediamine, piperazine, 2-methylpiperazine, 2,5-dimethylpiperazine, 2-hydroxytrimethylenediamine, diethylenetriamine, triethylenetriamine, triethylenetertramine, diethylaminopropylamine, tetraethylenepentamine, adducts of amines and epoxy compounds, and so on.

Polyisocyanates can also form high molecular weight compounds by reaction with water.

In forming microcapsules, water-soluble macromolecules can be used. They may by any of water-soluble anionic, nonionic and amphoteric macromolecules. As for the anionic macromolecules, both natural and synthetic ones, e.g., those having $-COO^{\ominus}$, $-SO_3^{\ominus}$, etc., can be used. Specific examples of anionic natural macromolecules include gum arabic, alginic acid, pectin, etc., and those of semi-synthetics include carboxymethyl cellulose, phthaloylated gelatin, sulfated starch, sulfated cellulose, lignin sulfonic acid, etc. As examples of synthetics of anionic macromolecules, mention may be made of maleic anhydride type copolymers (including hydrolysis products), acrylic acid type homo- and co-polymers (including those of methacrylic acid type), vinylbenzenesulfonic acid type homo- and co-polymers, carboxy-denatured polyvinyl alcohol, and so on.

As examples of nonionic macromolecules, mention may be made of polyvinyl alcohol, hydroxyethyl cellulose, methyl cellulose, and so on.

As for the amphoteric macromolecules, gelatin and the like can be used.

These water-soluble macromolecules are used in the form of an about 0.01 to about 10 wt % water solution. The size of the microcapsules is controlled to about 20 microns or less.

The size of capsules used in the present invention is about 80 microns or less, and sizes of about 20 microns or less are preferred from the standpoints of ensuring storage stability and treatment facility. On the other hand, when capsules are too small in size, it is feared that they are lost in holes or fibers of the substrate. Therefore, capsule sizes, although they cannot absolutely be stated because of dependence on the properties of the substrate or support used, are preferably about 0.1 micron or above.

It is to be desired that capsules to be used in the present invention should cause, in a substantial sense, no change under a pressure of about 10 Kg/cm$^2$ or less, and undergo rupture only when pressure greater than the foregoing value is imposed thereon. The magnitude of the pressure under which the rupture occurs can be changed depending on the intended use, so it should not be limited to particular values. However, it is preferred to rupture the capsules under a pressure of about 500 Kg/cm$^2$ or less. Such a pressure characteristic can be controlled by properly choosing the capsule size, the thickness of capsule wall, and the kinds of wall materials.

In encapsulating the polymerizable compounds and color image-forming substances to be used in the present invention, solvents can be used together. Also, solvents can be used when reducing agents, color developers and so on are introduced into a desired element. For instance, a solution prepared by dissolving ingredients as described above in water or a hydrophilic organic solvent, optionally together with a binder, is coated directly on a support, or introduced into a desired element according to known methods, e.g., the method disclosed in U.S. Pat. No. 2,322,027. Incorporation of a solvent in individual microcapsules enables control of the degree of rupture of the microcapsules and amount of the color image-forming substance transferred from the inside of capsule into an image-receiving element when pressure is applied. A suitable amount of a solvent used inside the microcapsules is from about 1 to about 500 parts by weight per 100 parts by weight of the polymerizable compounds.

Solvents usable in the microcapsules of the present invention are both natural and synthetic oils. Specific examples of such solvents include cotton seed oil, kerosene, aliphatic ketones, aliphatic esters, paraffin, naphthene oil, alkylated biphenyl, alkylated terphenyl, chlorinated paraffin, alkylated naphthalene, diarylethanes (such as 1-phenyl-1-xylylethane, 1-phenyl-1-p-ethylphenylethane, 1,1'-ditolylethane, etc.), phthalic acid alkyl esters (e.g., dibutyl phthalate, dioctyl phthalate), phosphoric acid esters (e.g., diphenyl phosphate, triphenyl phosphate, tricresyl phosphate, dioctylbutyl phosphate), citric acid esters (e.g., tributyl acetylcitrate), benzoic acid esters (e.g., octyl benzoate), alkylamides (e.g., diethyllaurylamide), fatty acid esters (e.g., dibutoxyethyl succinate, dioctyl acetate), trimesic acid esters (e.g., tributyl trimesate), lower alkyl acetates (such as ethyl acetate, butyl acetate, etc.), ethyl propionate, secondary butyl alcohol, methyl isobutyl ketone, β-ethoxyethylacetate, methyl cellosolve acetate, cyclohexanone, and so on.

An image-receiving element to be used together with the light-sensitive element comprising the composition of the present invention is an element for color development or fixation of the color image-forming substance released from the light-sensitive microcapsules. The light-sensitive microcapsules and the image-receiving element may by present in the same layer or separate layers provided on the same support, or in separate layers provided on different supports such as the combination of a light-sensitive sheet having the light-sensitive microcapsule-containing layer on a support with an image-receiving sheet having the image-receiving layer on another support.

In addition, the image-receiving element of the present invention may contain a mordant such as an anionic polymer or a cationic polymer, if needed. Therein, the anionic polymer and the cationic polymer may be used in combination.

In the light-sensitive and the image-receiving materials of the present invention, binders can be used alone or in combination. Representatives of hydrophilic binders are transparent or translucent ones, with specific examples including natural substances such as proteins, e.g., gelatin, gelatin derivatives, cellulose derivatives, etc., and polysaccharides, e.g., starch, gum arabic, etc.; and synthetic polymers such as water-soluble polyvinyl compounds, e.g., polyvinyl pyrrolidone, acrylamide polymers, etc. As examples of another synthetic polymer, there can be cited vinyl polymers dispersed in the latex form.

Also, addition vinyl polymers soluble in organic solvents can be used as a binder.

Supports which can be used for the light-sensitive material and the image-receiving material in the present invention are those which can withstand the processing pressure or the processing temperature. As for the general supports, not only glass, paper, wood free paper, coat paper, art paper, synthetic paper, metals and their analogues, but also an acetyl cellulose film, a cellulose ester film, a polyvinyl acetal film, a polystyrene film, a polycarbonate film, a polyethylene terephthalate film, and related films and resinous materials can be employed. In addition, paper supports laminated with polymers such as polyethylene and the like can be used. Also, polyester films described in U.S. Pat. Nos. 3,634,089 and 3,725,070 can be preferably used.

The light-sensitive material of the present invention can be provided with auxiliary layers such as a protective layer, an antistatic layer, an anticurl layer, a peel-apart layer, a matting layer, etc., if desired. In the protective layer, it is particularly desirable to incorporate an organic or inorganic matting agent for the purpose of prevention of adhesion.

Further, the light-sensitive material and the image-receiving material may contain an antifoggant, a brightening agent, a discoloration inhibitor, dyes and pigments for prevention of halation and irradiation (including white pigments such as titanium oxide), dyes for toning or coloring the materials, a thermal polymerization inhibitor, a surface active agent, a dispersed vinyl compound and so on, if needed.

Various exposure means can be employed in the present invention. In general, usually employed light sources, such as sunlight, Strobe, flash, a tungsten lamp, a mercury lamp, a halogen lamp like a iodine lamp, a xenon lamp, laser beams, a CRT light source, a plasma light source, a fluorescent tube, a light emitting diode and so on can be cited as examples. In addition, such exposure means as to combine a microshutter array with a linear or plate-form light source utilizing LCD (liquid crystal device), PLZT (lanthanum-doped lead titanozirconate), or so on can be employed.

For the purpose of enhancing the sensitivity, the layer containing the light-sensitive microcapsules of the present invention can be heated before, during and/or after the exposure.

In the present invention, images can also be developed in the exposed element by washing off the unexposed soluble part with a solvent, or thermally transferring the unexposed unhardened part into the image-receiving material, or other known methods. In the method of washing off with a solvent, not only organic solvents but also alkaline aqueous solutions can be used as a developing solvent. Examples of suitable developing solutions include a solution of an alkali carbonate such as sodium carbonate; a solution of an alkali hydroxide such as sodium hydroxide; a mixture thereof; an aqueous solution containing a lower alcohol, such as ethanol, isopropanol, etc., and an alkanolamine such as ethanolamine, propanolamine, 2-diethylaminoethanol, etc.; and their analogues.

The presence of s surface active agent in the developing solution can further clear development of the elements. An alkali strength of the developing solution depends on the characteristics of the composition used. Also, the developing solution can contain dyes, pigments, and so on. The developed images are rinsed with distilled water, and dried. After drying, the exposed images may further be exposed, if desired.

The present invention will now be described by reference to the following specific example which is not meant to be limiting. Unless otherwise specified, all percents, ratios, etc., are by weight.

EXAMPLE 1

The following photopolymerizable compositions B-1 to B-5 were prepared using the photopolymerization initiator solutions A-1 to A-5, respectively, shown in Table 1 below.

| | |
|---|---|
| Pentaerythritol tetraacrylate | 1.0 g |
| Benzyl methacrylate/methacrylic acid (73/27 by mole) copolymer | 0.8 g |
| Acetone | 5 g |
| Methyl ethyl ketone | 10 g |
| propylene glycol monomethyl ether acetate | 5 g |
| 2-Mercaptabenzoxazole | 0.06 g |
| Photopolymerization initiator solution (shown in Table 1) | See Table 1 |

TABLE 1

| Composition | A-1 | A-2 | A-3 | A-4 | A-5 |
|---|---|---|---|---|---|
| Dimethyl formamide | 5 g | 5 g | 5 g | 5 g | 5 g |

TABLE 1-continued

| Composition | A-1 | A-2 | A-3 | A-4 | A-5 |
|---|---|---|---|---|---|
| Organic boron compound anion salt of organic cationic dye (a) | — | 0.09 g | — | — | — |
| Organic cationic dye (b) | — | — | 0.073 g | 0.073 g | — |
| Organic boron compound anion (c) | — | — | 0.042 g | — | 0.042 g |

Organic boron compound anion salt of organic cationic dye (a):

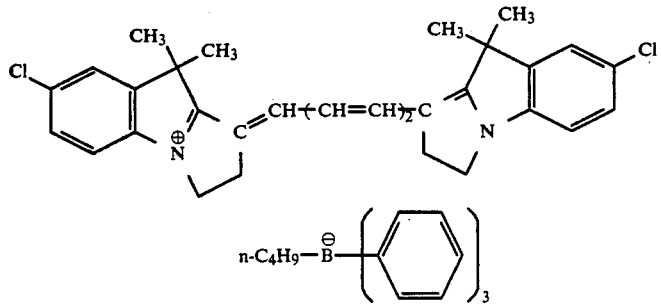

Organic cationic dye (b):

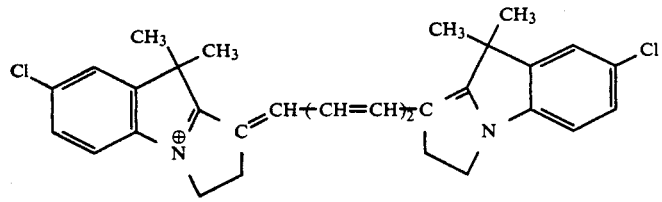

Organic boron compound (c):

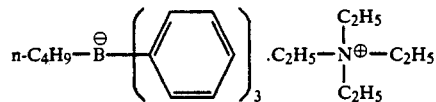

Each of the thus obtained photopolymerizable compositions B-1 to B-5 was coated on 100 μm-thick polyethylene terephthalate film in a dry thickness of 2 μm, and dried at 100° C. for 5 minutes. Further, the following overcoat layer was coated in a dry thickness of 1 μm, and dried at 100° C. for 2 minutes. Thus, light-sensitive sheets 1 to 5 were prepared.

| Coating composition for overcoat: | |
|---|---|
| Water | 98 g |
| Polyvinyl alcohol | 1.7 g |
| Hydroxypropylmethyl cellulose | 1.7 g |
| Polyvinyl pyrrolidone | 8.7 g |

Exposure was performed using an apparatus furnished with a vaccum printing frame, and each of the light-sensitive sheets 1 to 5 was exposed to a xenon lamp (made by Ushio Electric Inc.) through a stepwedge [density step difference: 0.15, density step number: 0 to 15 steps, trade name: Fuji Step Guide P (made by Fuji Photo Film Co., Ltd.)]. After exposure, the sensitive sheets were developed with the developing solution having the following formula.

| Developing solution | |
|---|---|
| Sodium carbonate (anhydrous) | 10 g |
| Butyl cellosolve | 5 g |
| Water to make | 1 liter |

The areas corresponding to the steps of low exposure wedges were eluted with the developing solution, and thereby the surface of the polyethylene terephthalate came to appear. Accordingly, the highest step number among the step wedges to which the uneluted areas corresponded was adopted as the step number of each sensitive material. Thus, a higher step number means that the sensitive material has a higher sensitivity.

The results obtained are shown in Table 2.

TABLE 2

| Light-Sensitive sheet | Polymerization Initiator solution used | Step number |
|---|---|---|
| 1 (Comparison) | A-1 | run out |
| 2 (Invention) | A-2 | 5th step |
| 3 (Invention) | A-3 | 6th step |
| 4 (Comparison) | A-4 | run out |
| 5 (Comparison) | A-5 | run out |

As can be seen from the results shown in tTable 2, the step number cannot be determined in the sensitive sheets prepared for comparison 1, 4 and 5 because the light-sensitive layer had not been hardened to result in the running of images.

On the other hand, the results set forth in Table 2 show that highly sensitive light-sensitive materials can be obtained by using a salt of the organic cationic dye of the present invention and an organic boron compound

What is claimed is:

1. A photopolymerizable composition which consists essentially of (a) a polymerizable compound having at least one ethylenic unsaturated bond, and (b) a salt formed by an organic cationic dye compound and an organic boron compound anion, wherein the salt is represented by the following formula (I), with the organic cationic dye compound (D⊕) being represented by the following formula (II):

$$\begin{array}{c} R^1 \\ \phantom{xx} \diagdown \phantom{xx} R^2 \\ \phantom{xxxx} B^\ominus \\ \phantom{xx} \diagup \phantom{xx} \diagdown \\ R^3 \phantom{xxxx} R^4 \end{array} \quad D^\oplus \qquad (I)$$

wherein D⊕ represents a cationic dye; and $R^1$, $R^2$, $R^3$ and $R^4$, which may be the same or different, each represents an alkyl group, an aryl group, an aralkyl group, an alkaryl group, an alkenyl group, an alkynyl group, an alicyclic group, a heterocyclic group, an allyl group, or a group derived therefrom, and two or more of the substituent groups $R^1$ to $R^4$ can combine to form a cyclic structure, $$\phi \oplus - L = \Psi \qquad (II)$$

wherein φ and Ψ, which may be the same or different, each represents a heterocyclic ring containing at least one nitrogen atom, and L represents a methine group, or a tri-, penta-, hepta- or nona-methine group formed by linking methine groups one after another by conjugated double bonds, each of which may be substituted, provided that L combines with at least either φ or Ψ to form a ring, wherein the heterocyclic ring represented by φ and Ψ is represented by the following formula φI to φXVI wherein each formula is represented by its corresponding structure bearing the positive charge

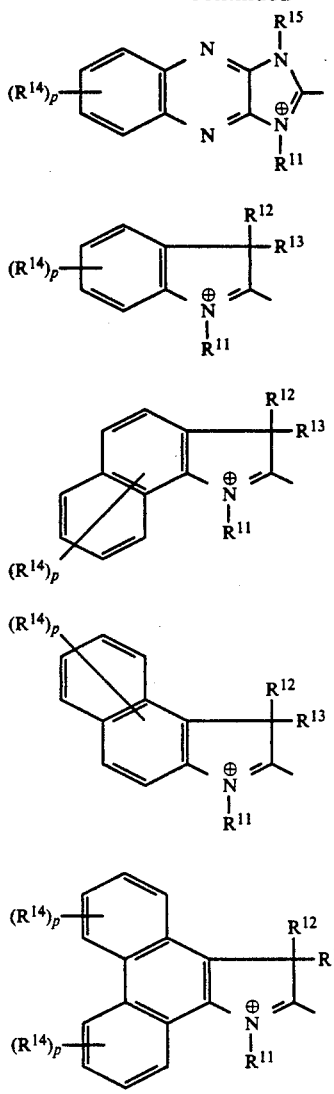

φXII

φXIII

φXIV

φXV

φXVI wherein the group represented by $R^{11}$ or $R^{15}$ in the heterocyclic ring of formula φI to φXVI is a substituted or unsubstituted alkyl, aryl or alkenyl group, provided that when $R^{11}$ or $R^{15}$ combines with L to form a ring, it corresponds to a divalent linking group represented by Z, wherein Z is a divalent linking group for completing a ring by combining with φ or Ψ, $R^{12}$ or $R^{13}$ is a unsubstituted or substituted alkyl group or unsubstituted or substituted aryl group, $R^{14}$ is an alkyl group, an aryl group, a heterocyclic ring residual group, a halogen atom, an alkoxy group, an aryloxy group, an alkylthio group, an arylthio group, an alkylcarbonyl group, an arylcarbonyl group, an alkyloxycarbonyl group, an aryloxycarbonyl group, an alkylcarbonyloxy group, an arylcarbonyloxy group, an alkylamido group, an arylamido group, an alkylcarbamoyl group, an arylamino group, an alkylsulfonyl group, an arylsulfonyl group, an alkylsulfonamido group, an arylsulfonamido group, an alkylsulfamoyl group, an arylsulfamoyl group, a cyano group or a nitro group, and p is an integer of 0 to 4, and when p is 2 or more, plural $R^{14}$'s may be the same or different from each other.

2. The photopolymerizable composition as in claim 1, wherein L is selected from the group represented by the following formulae (LI), (LII), (LIII), (LIV), (LV), (LVI), (LVII), (LVIII) and (LIX):

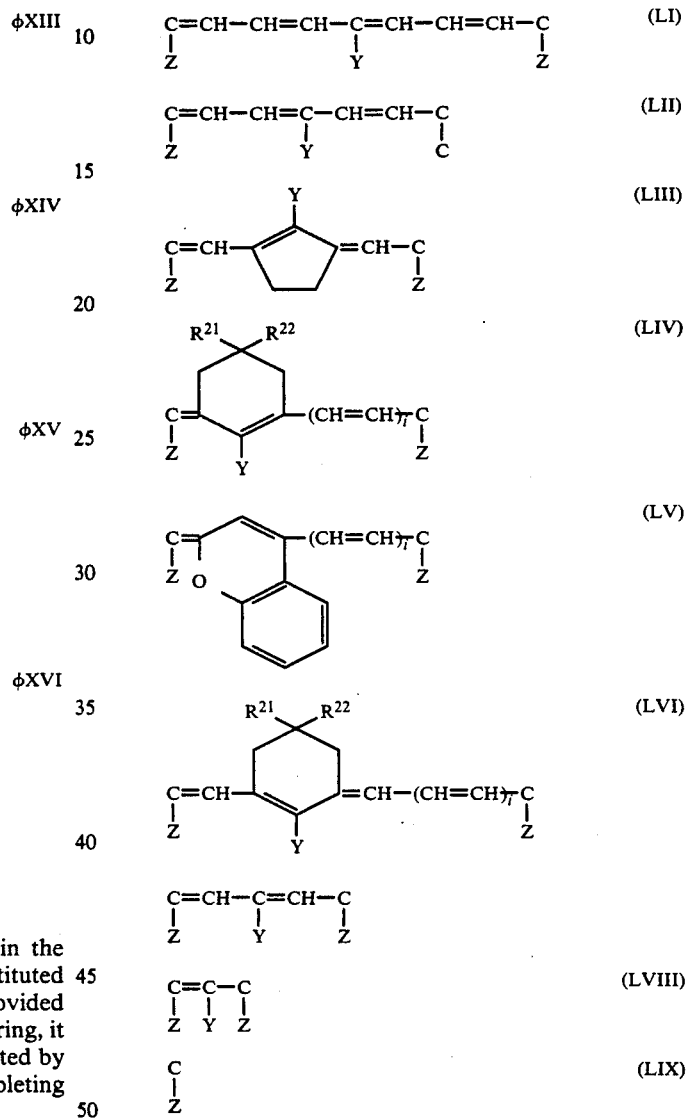

wherein i represents 0 or 1, Z in the formulae (LI) to (LIX) represents a hydrogen atom or a divalent group for completing a ring by combining with φ or Ψ, Y represents a hydrogen atom or a monovalent group, and $R^{21}$ and $R^{22}$ each represents a hydrogen atom or an alkyl group containing from 1 to 12 carbon atoms.

3. The photopolymerizable composition as in claim 1, wherein $R^1$, $R^2$, and $R^3$ of the formula (I) represent a phenyl group, a p-methoxyphenyl group, a p-butoxyphenyl group, a p-dimethylaminophenyl group or a p-chlorophenyl group and $R^4$ of the formula (I) represents a methyl group, an ethyl group, a propyl group, a butyl group, an n-hexyl group, an n-heptyl group or a benzyl group.

* * * * *